United States Patent
Arrigoni et al.

(10) Patent No.: US 12,300,585 B2
(45) Date of Patent: May 13, 2025

(54) SEMICONDUCTOR DEVICE WITH ELECTRICAL COMPONENT FOR BRIDGING LEADFRAME AND CHIP MOUNTING PORTION AND CORRESPONDING METHOD OF MANUFACTURE

(71) Applicant: STMicroelectronics S.r.l., Agrate Brianza (IT)

(72) Inventors: Alberto Arrigoni, Eupilio (IT); Giovanni Graziosi, Vimercate (IT); Aurora Sanna, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 18/369,652

(22) Filed: Sep. 18, 2023

(65) Prior Publication Data
US 2024/0006277 A1   Jan. 4, 2024

Related U.S. Application Data

(62) Division of application No. 16/745,043, filed on Jan. 16, 2020, now Pat. No. 11,764,134.

(30) Foreign Application Priority Data

Jan. 22, 2019  (IT) .......................... 102019000000929

(51) Int. Cl.
*H01L 23/495* (2006.01)
*H01L 21/48* (2006.01)

(52) U.S. Cl.
CPC .... *H01L 23/49589* (2013.01); *H01L 21/4825* (2013.01); *H01L 23/49503* (2013.01); *H01L 23/4952* (2013.01)

(58) Field of Classification Search
CPC .......... H01L 21/4825; H01L 23/49589; H01L 23/49503; H01L 23/4952
See application file for complete search history.

(56) References Cited

U.S. PATENT DOCUMENTS

| | | |
|---|---|---|
| 6,611,434 B1 | 8/2003 | Lo et al. |
| 7,960,816 B2 | 6/2011 | Chow et al. |
| | (Continued) | |

FOREIGN PATENT DOCUMENTS

| | | |
|---|---|---|
| CN | 101350318 A | 1/2009 |
| CN | 101752357 A | 6/2010 |
| | (Continued) | |

OTHER PUBLICATIONS

AI-Assisted, improved translation of Bonshihara, S61134060 (as cited in the IDS).*

(Continued)

*Primary Examiner* — Suberr L Chi
(74) *Attorney, Agent, or Firm* — Crowe & Dunlevy LLC

(57) ABSTRACT

Disclosed herein is a method for manufacturing a semiconductor product package. The method includes arranging a leadframe with one or more leads such that each lead has an inner end facing a portion of a die-pad, attaching a semiconductor chip to the die-pad, attaching a first electrically conductive mass to the die-pad such that it is aligned with the inner end of a lead protruding over the die-pad, attaching an electrical component to the first electrically conductive mass such that a longitudinal axis of the electrical component is arranged traverse to the die-pad, and coupling a second electrically conductive mass between a termination of the electrical component and the inner end of the lead.

18 Claims, 4 Drawing Sheets

(56) References Cited

U.S. PATENT DOCUMENTS

| | | |
|---|---|---|
| 2002/0195693 A1 | 12/2002 | Liu et al. |
| 2005/0224945 A1 | 10/2005 | Saito et al. |
| 2008/0023843 A1 | 1/2008 | Hiraga |
| 2009/0160038 A1 | 6/2009 | Fan et al. |
| 2019/0088621 A1 | 3/2019 | Yang et al. |
| 2019/0115287 A1 | 4/2019 | Derai et al. |
| 2019/0274219 A1 | 9/2019 | Gottwald et al. |
| 2020/0235045 A1 | 7/2020 | Arrigoni et al. |
| 2021/0305203 A1 | 9/2021 | Graziosi et al. |

FOREIGN PATENT DOCUMENTS

| | | |
|---|---|---|
| CN | 101887876 A | 11/2010 |
| CN | 204885153 U | 12/2015 |
| CN | 211376632 U | 8/2020 |
| JP | S61134060 A | 6/1986 |
| JP | S63132459 A | 6/1988 |
| JP | H09199666 A | 7/1997 |
| JP | H10070234 A | 3/1998 |

OTHER PUBLICATIONS

IT Search Report and Written Opinion for IT Appl. No. 102019000000929 dated Sep. 30, 2019 (8 pages).
CN First Office Action and Search Report for counterpart CN Appl. No. 202010075035.7, report dated Dec. 4, 2024, 7 pgs.

\* cited by examiner

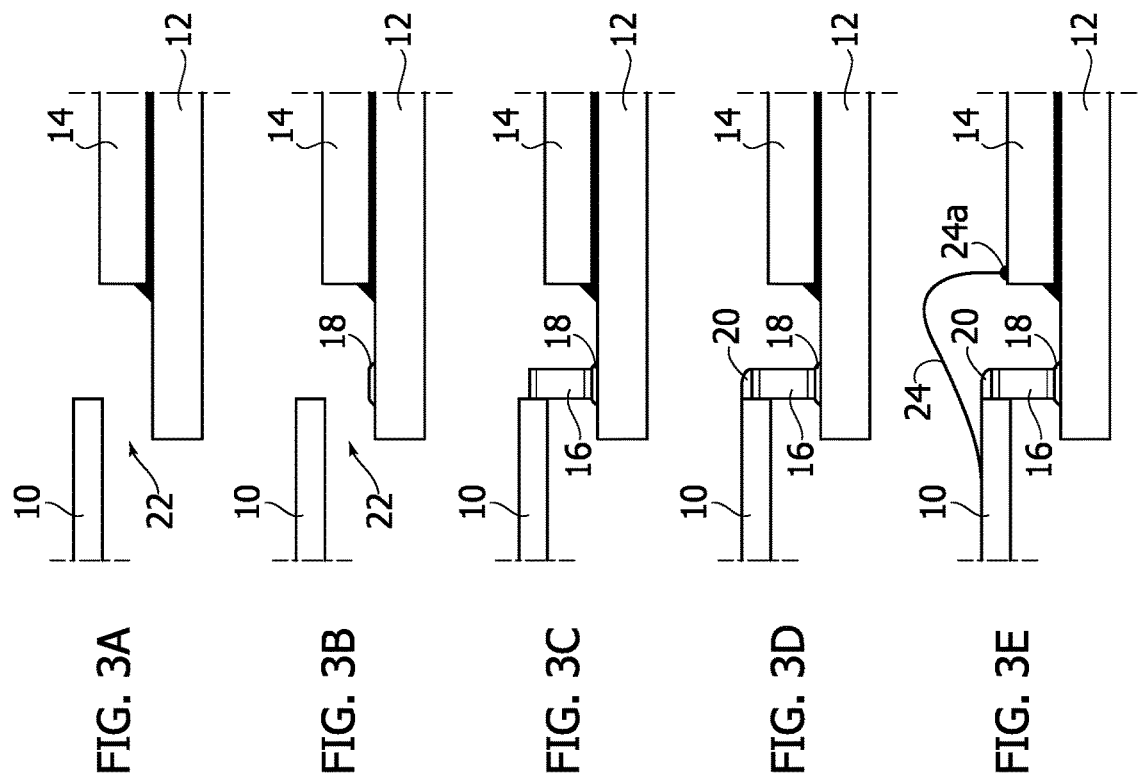
FIG. 3A
FIG. 3B
FIG. 3C
FIG. 3D
FIG. 3E
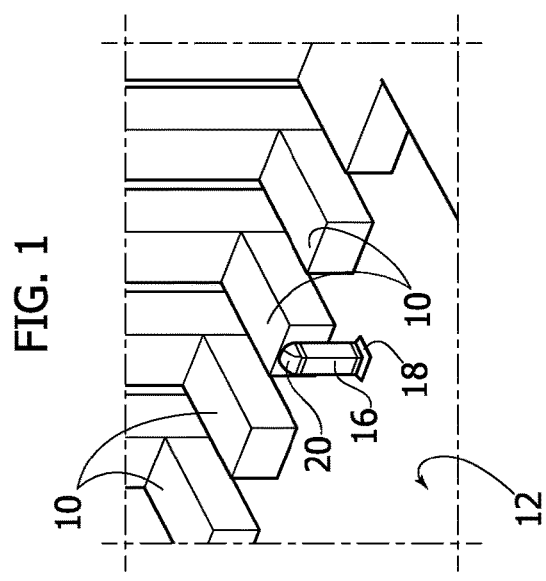
FIG. 1
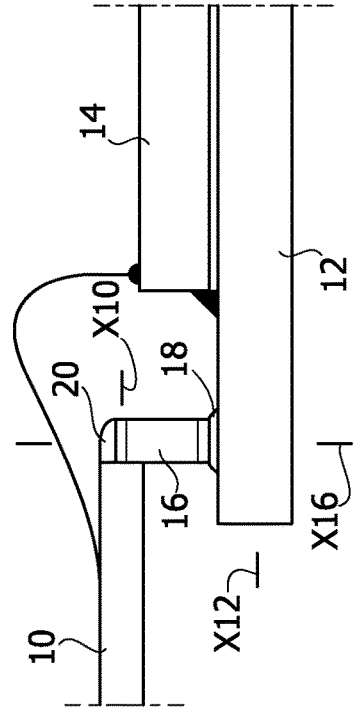
FIG. 2

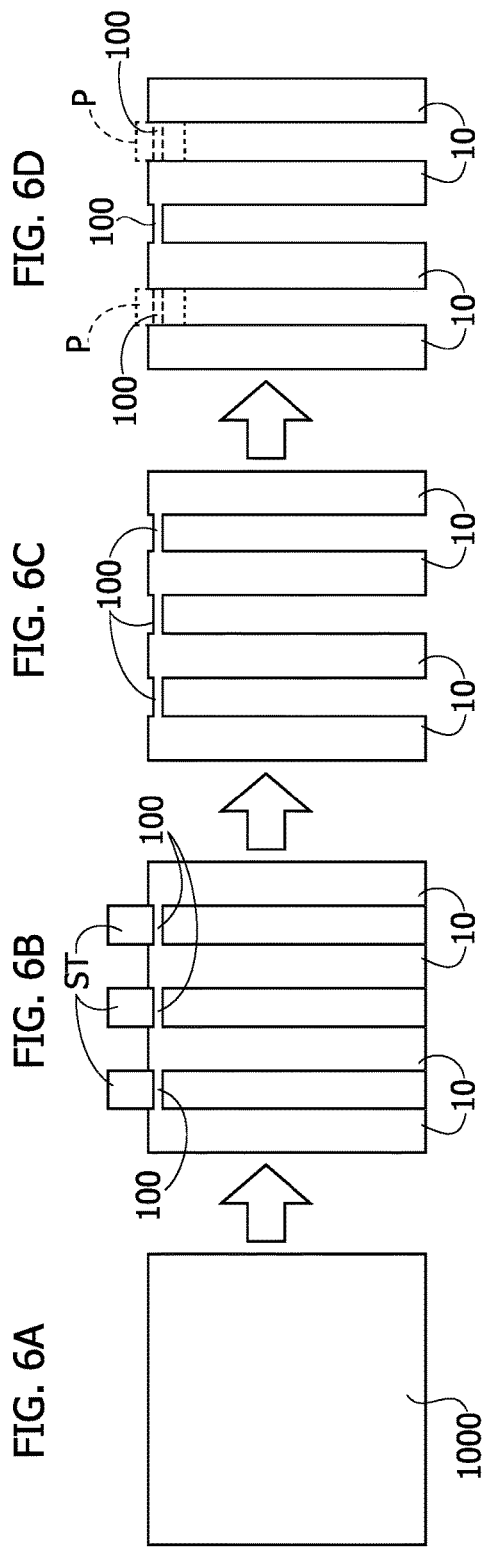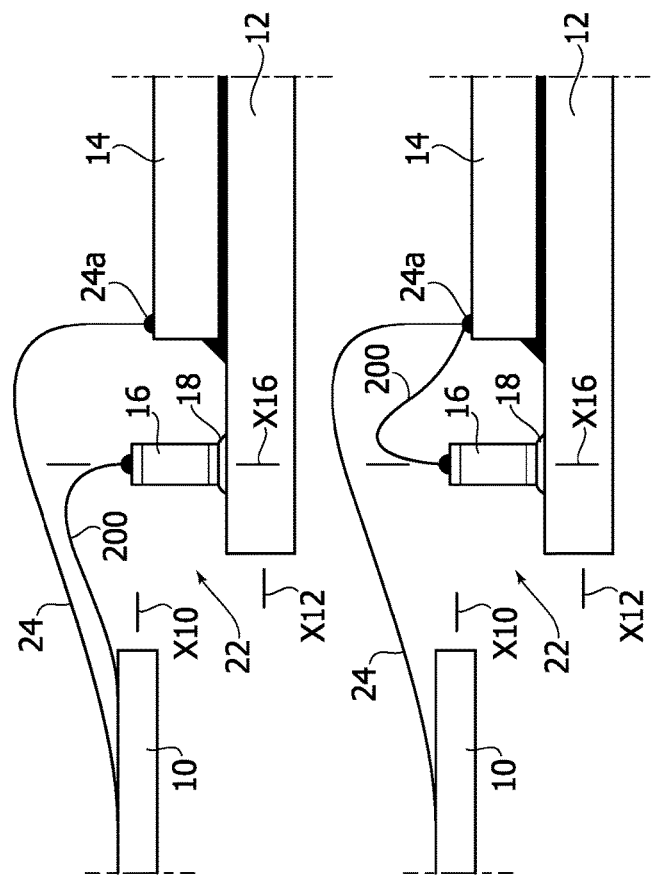

SEMICONDUCTOR DEVICE WITH ELECTRICAL COMPONENT FOR BRIDGING LEADFRAME AND CHIP MOUNTING PORTION AND CORRESPONDING METHOD OF MANUFACTURE

PRIORITY CLAIM

This application is a division of U.S. patent application Ser. No. 16/745,043, filed on Jan. 16, 2020, now U.S. Pat. No. 11,764,134, which claims the priority benefit of Italian Application for Patent No. 102019000000929, filed on Jan. 22, 2019, the contents of which are hereby incorporated by reference in their entireties to the maximum extent allowable by law.

TECHNICAL FIELD

The description relates to semiconductor devices. One or more embodiments may apply, for instance, to integrated circuits (ICs).

BACKGROUND

Present-day printed circuit boards (PCBs) for integrated circuits are "populated" by (many) components such as integrated circuit (IC) devices (which may be arranged in plastic/ceramic packages), passive components, connectors and so on.

An increasing tendency exists towards integrating components (passive components such as capacitors, inductors, for instance) into the IC device packages, thereby removing them from the PCB surface.

Resorting to such an approach, oftentimes referred to as "system in package" or SiP, may be advantageous in terms of PCB space saved and may facilitate PCB miniaturization.

Such an approach may be considered for application to arrangements where SMD (surface mount device) technology is adopted with a SMD electrically connected via electrically-conductive formations such as wire bonding and/or leads from a leadframe (LF).

Despite the extensive activity in that area, further improved solutions are desirable. For instance, improvements in terms of the impedance behavior exhibited by the components integrated in a package may be desirable.

There is accordingly a need in the art improved solutions.

Various solutions have been proposed for addressing issues related to electrical component integration in a semiconductor product package.

Documents such as U.S. Pat. Nos. 6,611,434 and 7,960,816 B2 or United States Patent Application Publication No. 2002/195693 are exemplary of such solutions (these documents being incorporated herein by reference).

Such solutions may suffer from various drawbacks related to poor electrical performance related to long connection formations as provided for coupling a (passive, for instance) electrical component to an integrated circuit (an application-specific integrated circuit or ASIC, for instance), with intermediate elements or substrate parts possibly intervening.

SUMMARY

According to one or more embodiments, a semiconductor device and a corresponding method of manufacturing semiconductor devices are provided.

One or more embodiments may comprise component integrated in a package (a SMD for instance) mounted "vertically" on a die-pad abutted against and coupled to a dedicated lead of the leadframe.

One or more embodiments were found to provide up to 40% impedance reduction in a capacitive component above 30 MHz.

One or more embodiments may provide a leadframe package including a two-terminal SMD mounted/coupled vertically on a die-pad and having its other terminal electrically coupled through a lead or a wire, for instance.

Disclosed herein is a method of manufacturing, including: arranging a semiconductor chip on a chip mounting portion of a leadframe, wherein the leadframe has at least one lead arranged facing the chip mounting portion, the at least one lead lying in a first plane and the chip mounting portion lying in a second plane, the first plane and the second plane mutually offset with a gap therebetween; and arranging an electrical component on the chip mounting portion extending between the first plane and the second plane.

The method may further include providing a wire-like material electrically coupling the leadframe to the semiconductor chip on the chip mounting portion.

Providing said wire-like material may include applying a clamp to the leadframe wherein said clamp does not apply clamping to said at least one lead in the leadframe arranged facing the chip mounting portion.

The method may further include electrically coupling the electrical component to the semiconductor chip on the chip mounting portion using the provided wire-like material.

Arranging the electrical component on the chip mounting portion may include aligning a longitudinal axis of an elongate electrical component transverse to the second plane.

The method may further include electrically coupling the chip mounting portion and the electrical component using a first electrically-conductive formation.

Electrically coupling the chip mounting portion and the electrical component using the first electrically-conductive formation may include depositing an electrically-conductive material that both electrically and mechanically couples the electrical component to the chip mounting portion.

The method may further include forming at least one second electrically-conductive formation to electrically couple the electrical component to the at least one lead facing the chip mounting portion.

Forming the at least one second electrically-conductive formation may further include depositing an electrically-conductive material that both electrically and mechanically couples the electrical component to the at least one lead.

Arranging the electrical component may include positioning the electrical component sidewise of the at least one lead such that it extends between the chip mounting portion and a lateral surface of the at least one lead.

The electrical component may be arranged to have a length longer than a distance between the chip mounting portion and the at least one lead transverse to the first plane and the second plane.

The method may further include arranging at least one second lead in the leadframe parallel and adjacent to the at least one lead facing the chip mounting portion and forming a wire-like bond between the semiconductor chip and the at least one second lead.

Also disclosed herein is a method for manufacturing a semiconductor product package, including: arranging a leadframe comprising one or more leads such that each lead has an inner end facing a portion of a die-pad; attaching a semiconductor chip to the die-pad; attaching a first electrically conductive mass to the die-pad such that it is aligned with the inner end of a lead protruding over the die-pad; attaching an electrical component to the first electrically conductive mass such that a longitudinal axis of the electrical component is arranged traverse to the die-pad; and coupling a second electrically conductive mass between a termination of the electrical component and the inner end of the lead.

The method may further include applying an agent to facilitate adhesion of the first electrically conductive mass to the die-pad before attaching the first electrically conductive mass.

The attaching of the electrical component may include positioning the electrical component such that its primary dimension is transverse to the die-pad.

The method may further include providing a wire bonding to facilitate electrical coupling of the lead with pads on a surface of the semiconductor chip.

The electrical component may be attached such that it is positioned bridge-like across a gap between the lead and the die-pad.

The leadframe may be arranged such that the inner end of the lead overlaps a portion of the die-pad.

BRIEF DESCRIPTION OF THE DRAWINGS

One or more embodiments will now be described, by way of example only, with reference to the annexed figures, wherein:

FIG. 1 is illustrative of a portion of a semiconductor device according to embodiments of the present description, FIG. 2 is a side-view representation of a portion of a semiconductor device according to embodiments of the present description, FIGS. 3A to 3E are exemplary of possible steps in producing an arrangement as exemplified in FIG. 2, FIGS. 4, 5 and 6A to 6D are exemplary of possible further steps in producing embodiments of the present description, FIG. 7 and FIG. 8 are side-view representations of a portion of a semiconductor device according to embodiments of the present description.

DETAILED DESCRIPTION

Figure 4:
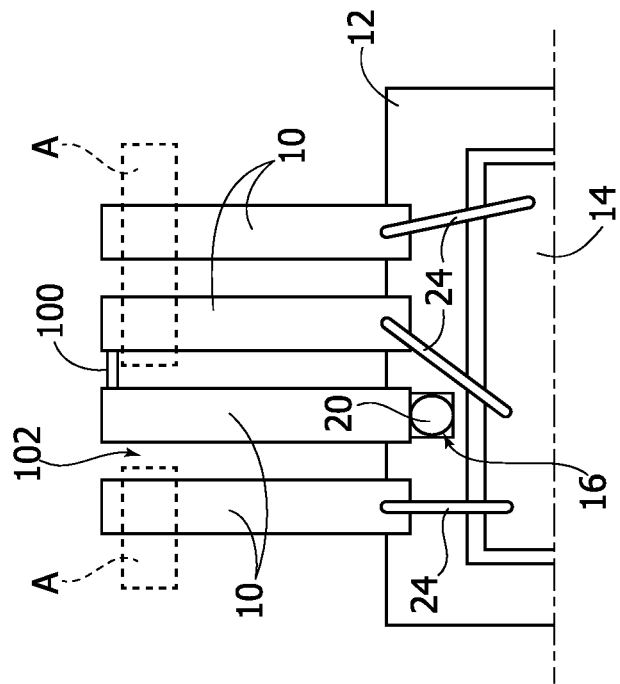

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

FIG. 1 is exemplary of a portion of a semiconductor product package including one or more leads 10 in a leadframe (not visible in its entirety) having their inner ends facing and at least partially overlapping a portion 12 of the package (a so-called die-pad or slug) onto which one or more semiconductor chips or dice 14 are intended to be mounted (in a manner known to those of skill in the art).

Throughout the rest of this description, only one such semiconductor chip or die 14 will be considered for the sake of simplicity.

Reference 16 denotes an electrical component (a passive component such as a decoupling capacitor, for instance) arranged bridge-like between one (electrically-conductive) lead 10 and the (electrically-conductive) pad or slug 12 to provide electrical coupling therebetween.

In one or more embodiments as exemplified in FIG. 2 (and in FIGS. 7 and 8 as well), the lead 10 and the pad or slug 12 may be regarded as extending in respective—at least approximately parallel—(e.g. median) planes X10 and X12 which are mutually offset with the component 16 extending between these two planes.

In one or more embodiments, such electrical coupling can be provided—as discussed in the following—via electrically-conductive masses 18 and 20.

A SMD capacitor such as an EIA SIZE 0201 (length× width 0.6×0.3 mm) capacitor or an EIA SIZE 0402 (length× width 1.0×0.5 mm) capacitor may be exemplary of a component such as the component 16.

As exemplified herein, the component 16 may be of elongate form or shape, namely a form long in comparison to its width, for instance a length twice the width as in the case of the EIA SIZE 0201 or EIA SIZE 0402 capacitors mentioned previously by way of example.

In one or more embodiments, the component 16 may thus be mounted bridge-like between the lead 10 and the pad or slug 12 with a longitudinal axis X16 (that is the axis along the direction of longer or longest extension of the component 16) arranged transverse the pad or slug 12 (for example, perpendicular to the planes X10 and X12 and extending therebetween).

For instance, the component 16 may be mounted with the longitudinal axis X16 orthogonal to a plane of extension X12 of the pad or slug 12. For instance, by assuming that the pad or slug 12 may be regarded as lying in a horizontal plane X12, the elongate component 16 may be arranged with its axis X16 arranged vertically.

In the exemplary sequence of steps of FIGS. 3A to 3E, FIG. 3A shows a leadframe provided (in a manner known to those of skill in the art) with one or more leads 10 having a (inner) end facing a corresponding (peripheral, for instance) portion of the pad or slug 12 with a separation gap 22 therebetween.

As exemplified in FIG. 3A, the inner end of the lead 10 may overlap (that is, protrudes above) the portion of the pad or slug 12. It will be otherwise appreciated (see FIGS. 7 and 8 discussed in the following, for instance) that such an overlap is not a mandatory feature.

In FIG. 3A a semiconductor chip or die 14 is shown already attached (in any manner known to those of skill in the art) onto the pad or slug 12.

FIG. 3B is exemplary of an act of providing onto the die-pad or slug 12 a (first) electrically-conductive mass (vertically) aligned with the end of the lead 10 protruding over the pad or slug 12.

In one or more embodiments, the mass 18 may comprise a preform or solder material applied onto the pad or slug 12 possibly after an agent (or flux) has been dispensed to facilitate firm adhesion of the mass 18 to the pad or slug 12.

FIG. 3C is exemplary of a component 16 being placed onto the mass 18 which, as discussed previously, may involve placing an elongate component 16 "vertically", that is with its main dimension X16 extending transverse to the pad or slug 12.

FIG. 3D is exemplary of a (second) mass of electrically-conductive material 20 being provided between the (upper) termination of the component 16 and the inner tip of the lead 10.

In one more embodiments, the mass 20 may include a preform or solder material. In one or more embodiments the act exemplified in FIG. 3D may also include solder reflow and agent (or flux) cleaning.

FIG. 3E is exemplary of the possible provision of (otherwise conventional) wire or ribbon bonding 24 to provide electrical coupling of the lead 10 with corresponding die pads (see reference 24a) at the front or upper surface of the semiconductor chip or die 14.

While advantageous for various aspects, the sequence of acts exemplified in FIGS. 3A to 3E is not mandatory. For instance, just to mention one possible alternative, the semiconductor die or chip 14 may be attached to the pad or slug 12—after—the component 16 has been arranged bridge-like across the gap 22 between the lead 10 and the pad or slug 12.

FIGS. 1 and 2 (and FIGS. 3C to 3E as well) are exemplary of the possibility for the component 16 to extend bridge-like between the chip mounting portion 12 and a lateral surface of the lead 10 in abutment with that lateral surface, thus extending sidewise of the lead rather than being sandwiched between the lead 10 and the pad or slug 12.

As appreciable in FIGS. 1 and 2 (and FIGS. 3C to 3E as well), the lead 10 may exhibit a lateral surface, such as a "vertical" end surface transverse the plane X10 and/or X12, so that the component 16 can be abutted at its end (here an upper end) facing the lead 10 against the lateral surface of the lead 10.

As appreciable in FIGS. 1 and 2 (and FIGS. 3C to 3E as well), this may also facilitate placement from the top of the leadframe and/or using a component 16 having a length longer than the distance between the lead 10 and the pad or slug 12 as measured transverse (orthogonal) to the planes X10 and X12.

One or more embodiments may take into account the fact that in certain embodiments the lead 10 may be a power lead. A rigid joint to the pad or slug 12 as created via the electrical component 16 may thus be exposed to the risk of breaking as a result of the lead being clamped (at a clamping area A as exemplified in FIG. 4) at wire bonding.

In one or more embodiments, such an issue may be addressed by providing a physical connection (for instance a bridge contact as exemplified as 100 in FIG. 5) between the (power) lead 10 to which the component 16 is coupled and at least one adjacent lead 10 having such a rigid joint to the pad or slug 12.

Figure 5:
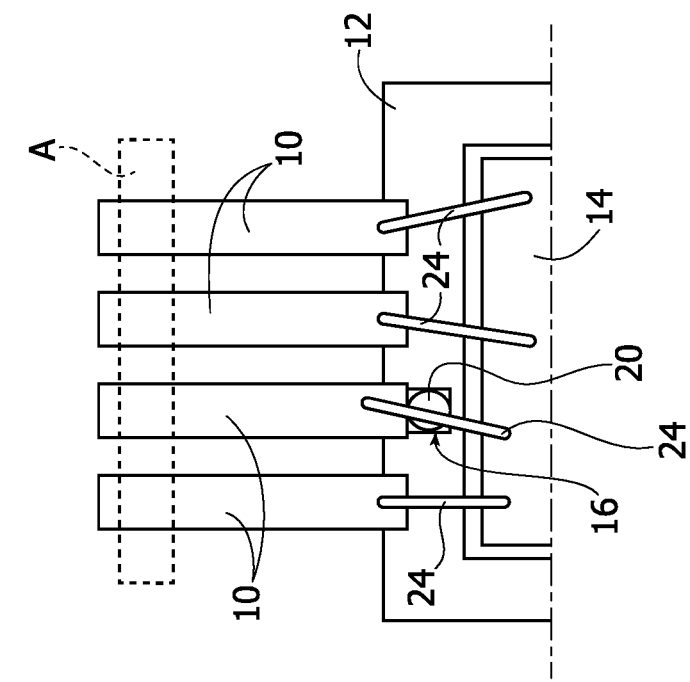

One or more embodiments may contemplate modifying the clamping foot design intended to act at the clamping area A by providing a gap therein as exemplified at 102 in FIG. 5.

A local relief can thus be provided at the lead 10 to which the component 16 is coupled by avoiding applying clamping force thereto, while—as exemplified in FIG. 5—a (power) wire coupling to the chip of die 12 may be provided for the power lead 10 to which the component 16 is coupled via an adjacent lead 10 (on the right, in FIG. 5) physically connected thereto (via the bridge contact 100, for instance).

The sequence of FIGS. 6A to 6D is exemplary of the possible provision of such a physical (mechanical) connection between adjacent leads 10, which may be provided via one or more bridges 100 as exemplified in FIG. 5.

Specifically, the sequence of FIGS. 6A and 6B is exemplary of a stamping process applied to a raw base material (e.g. copper in reel form) 1000 for the leadframe.

Stamping tool flexibility in such a process may facilitate (possibly during leadframe manufacturing by a supplier) adding/removing punches and changing their positions in order to provide a pin-to-pin (lead-to-lead) electrical connection (100, for instance) where desired.

For instance, FIG. 6B is exemplary of a stamping process via a stamping tool ST resulting in a plurality of leads 10 being physically (and also electrically) coupled to one another via bridges 100 as exemplified in FIG. 6C.

A stamping process as exemplified herein may include a further act of punching away (as exemplified at P in FIG. 6D) those pin-to-pin connection which may not be desired for a certain application.

The possibility of using a same lead 10 as a power lead for a plurality of semiconductor products (ICs, for instance) may facilitate adopting a standardized location of physical connection thus facilitating leadframe design standardization.

FIGS. 7 and 8 exemplify one or more embodiments applied to arrangements (such as QFP packages—QFP being an acronym for Quad Flat Package) including leads 10 facing a pad or slug 12 and defining a gap 22 therewith without protruding above the pad or slug 12.

Here again, the lead 10 and the pad or slug 12 may be regarded as extending in respective (at least approximately parallel) planes X10 and X12 (e.g. median planes of the lead 10 and the pad or slug 12, respectively) which are mutually offset with the component 16 extending between these two planes.

In one or more embodiments as exemplified in FIGS. 7 and 8 the electrically-conductive mass 20 discussed in the foregoing may be replaced by wire (or possibly ribbon) bonding 200 which electrically couples to the lead 10 the termination of the component 16 opposite to the pad or slug 12.

Such wire or ribbon bonding of the component 16 to the lead 10 may be:
  direct, as exemplified in FIG. 7, which may involve electrode finishing compatible with wire bonding technology,
  indirect, as exemplified in FIG. 8, that is via the die-pads 24a provided for the lead-to-die bonding 24 which may facilitate and optimized wire length.

One or more embodiments as exemplified in FIGS. 7 and 8 may retain the advantage of arranging an elongate component 16 such as an EIA SIZE 0201 or EIA SIZE 0402 capacitor transverse to the pad or slug 12 (vertical, for instance) thus reducing the footprint of the component 16 on the pad or slug 12.

One or more embodiments as exemplified in FIGS. 7 and 8 are again exemplary of the possibility for the component 16 to have a length longer than the distance between the lead 10 and the pad or slug 12, as measured transverse (orthogonal) to the planes X10 and X12, as a result of extending sidewise of the lead 10.

Figure 9:
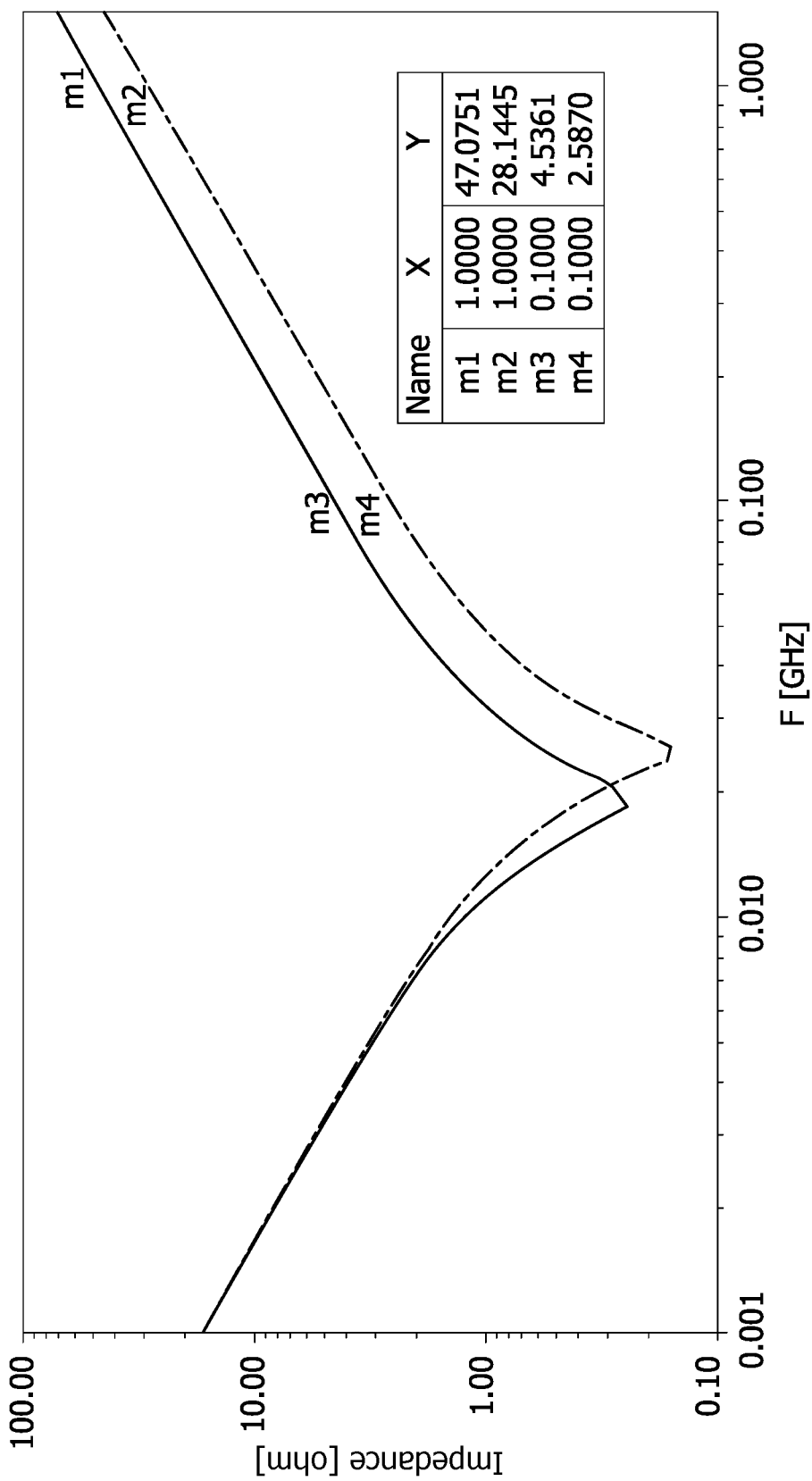
FIG. 9 is a diagram exemplary of a possible impedance versus frequency behavior in embodiments of the present description.

The diagram of FIG. 9 is exemplary of the impedance (Ohm) measured over a frequency range between 0.001 and 1.000 GHz for a 0201 SMD capacitor having a nominal capacitance value of 10 nF.

The impedance behavior for a capacitor assembly according to embodiments of the present description as (illustrated by the chained line in FIG. 9) shows an improvement in excess of 40% in comparison with the impedance behavior for a conventional capacitor assembly (shown in continuous line) over the whole of the frequency range above the frequency where the lowest impedance is measured.

One or more embodiments may thus provide an optimized electrical connection from a ground electrode (as provided by the pad or slug 12) to the back side of the die 14 achieved through a slug and not through a wire, while also exhibiting a shorter wire connection from the leads 10 (for instance a power lead) to the die 14.

One or more embodiments may facilitate reducing (notionally halving) the number of dedicated power supply pins in a semiconductor device such as an integrated circuit in comparison with conventional planar SMD assembly, while also facilitating leadframe design standardization as discussed previously.

A device as exemplified herein may comprise:
at least one semiconductor chip (for instance, 14),
a leadframe (for instance, 10, 12) comprising a chip mounting portion (for instance, 12) having the at least one semiconductor chip thereon and at least one lead (for instance, 10) arranged facing the chip mounting portion, the at least one lead lying in a first plane (for instance, X10) and the chip mounting portion lying in a second plane (for instance, X12), the first plane and the second plane mutually offset with a gap (for instance, 22) therebetween, and
an electrical component (for instance, 16) arranged on the chip mounting portion and extending between the first plane and the second plane.

A device as exemplified herein may comprise an elongate electrical component extending along a longitudinal axis (for instance, X16), the electrical component arranged on the chip mounting portion with said longitudinal axis transverse (for instance, orthogonal to) the second plane.

A device as exemplified herein may comprise:
a first electrically-conductive formation (for instance, 18) electrically coupling the chip mounting portion and the electrical component arranged on the chip mounting portion, and
at least one second electrically-conductive formation (for instance, 20; 200; 200, 24) electrically coupling the electrical component to the at least one lead arranged facing the chip mounting portion.

In a device as exemplified herein, the first electrically-conductive formation may comprise electrically-conductive material electrically and mechanically coupling the electrical component and the chip mounting portion.

In a device as exemplified herein said at least one lead may be arranged facing and at least partially overlapping the chip mounting portion (see, for instance, FIG. 2), the electrical component extending bridge-like between the chip mounting portion and the at least one lead arranged facing the chip mounting portion.

In a device as exemplified herein the second electrically-conductive formation may comprise electrically-conductive material electrically and mechanically (see, for instance 20 in FIG. 2) coupling the electrical component to the at least one lead arranged facing and at least partially overlapping the chip mounting portion.

In a device as exemplified herein, the at least one second electrically-conductive formation may comprise wire-like (wire or ribbon) material (for instance, 200 or 200, 24) electrically coupling the electrical component to the at least one lead arranged facing the chip mounting portion either directly (see, for instance 200 in FIG. 7) or (see, for instance 200, 24 in FIG. 8) via the at least one semiconductor chip on the chip mounting portion.

In a device as exemplified herein (see, for instance, FIGS. 1 and 2 and FIGS. 3C to 3E), the electrical component (for instance, 16) may extend sidewise of the at least one lead between the chip mounting portion and a lateral surface of the at least one lead in abutment with said lateral surface.

In a device as exemplified herein (see, for instance, FIGS. 1 and 2 and FIGS. 3C to 3E plus FIGS. 7 and 8,) the electrical component may have a length longer than the distance between said chip mounting portion and said at least one lead transverse (orthogonal to, for instance) said first plane and said second plane.

A device as exemplified herein may comprise:
at least one second lead (see, for instance, the third lead 10 from left in FIG. 5) in the leadframe arranged sidewise said at least one lead arranged facing the chip mounting portion, the at least one second lead mechanically and electrically coupled (100) to said at least one lead in the leadframe arranged facing the chip mounting portion, and
wire-like (for instance, wire of ribbon) bonding (see FIG. 5) between the at least one semiconductor chip on the chip mounting portion and the at least one second lead in the leadframe, wherein the electrical component is electrically coupled to the at least one semiconductor chip on the chip mounting portion via said wire-like bonding between the at least one semiconductor chip on the chip mounting portion and said at least one second lead in the leadframe.

A method of manufacturing a device as exemplified herein may comprise:
arranging the at least one semiconductor chip on the chip mounting portion of the leadframe, the leadframe having said at least one lead arranged facing the chip mounting portion, the at least one lead lying in a first plane and the chip mounting portion lying in a second plane, the first plane and the second plane mutually offset with a gap therebetween,
arranging the electrical component on the chip mounting portion (the electrical component) extending between the first plane and the second plane.

A method as exemplified herein may comprise providing wire-like material (for instance, 24 in FIGS. 4 and 5) electrically coupling the leadframe to the at least one semiconductor chip on the chip mounting portion, wherein providing said wire-like material may comprise applying clamping (for instance, at A) to the leadframe wherein the method may comprise refraining (for instance, at 102 in FIG. 5) from applying clamping to said at the least one lead in the leadframe arranged facing the chip mounting portion.

Without prejudice to the underlying principles, the details and embodiments may vary, even significantly, with respect to what has been described by way of example only, without departing from the extent of protection. The extent of protection is determined by the annexed claims.

The claims are an integral part of the technical teaching provided herein in respect of the embodiments.

The invention claimed is:

1. A method of manufacturing, comprising:
arranging a semiconductor chip on a chip mounting portion of a leadframe, wherein the leadframe has at least one lead arranged facing the chip mounting portion, the at least one lead lying in a first plane and the chip mounting portion lying in a second plane, the first plane and the second plane mutually offset with a gap therebetween; and
arranging an electrical component on the chip mounting portion, the electrical component arranged with its longitudinal axis extending transverse to and between the first plane and the second plane.

2. The method of claim 1, further comprising providing a wire-like material electrically coupling the leadframe to the semiconductor chip on the chip mounting portion.

3. The method of claim 2, wherein providing said wire-like material comprises applying a clamp to the leadframe wherein said clamp does not apply clamping to said at least one lead in the leadframe arranged facing the chip mounting portion.

4. The method of claim 2, further comprising electrically coupling the electrical component to the semiconductor chip on the chip mounting portion using the provided wire-like material.

5. The method of claim 1, wherein arranging the electrical component on the chip mounting portion comprises aligning a longitudinal axis of an elongate electrical component transverse to the second plane.

6. The method of claim 1, further comprising electrically coupling the chip mounting portion and the electrical component using a first electrically-conductive formation.

7. The method of claim 6, wherein electrically coupling the chip mounting portion and the electrical component using the first electrically-conductive formation comprises depositing an electrically-conductive material that both electrically and mechanically couples the electrical component to the chip mounting portion.

8. The method of claim 1, further comprising forming at least one second electrically-conductive formation to electrically couple the electrical component to the at least one lead facing the chip mounting portion.

9. The method of claim 8, wherein forming the at least one second electrically-conductive formation comprises depositing an electrically-conductive material that both electrically and mechanically couples the electrical component to the at least one lead.

10. The method of claim 1, wherein arranging the electrical component comprises positioning the electrical component sidewise of the at least one lead such that it extends between the chip mounting portion and a lateral surface of the at least one lead.

11. The method of claim 1, wherein the electrical component is arranged to have a length longer than a distance between the chip mounting portion and the at least one lead transverse to the first plane and the second plane.

12. The method of claim 1, further comprising arranging at least one second lead in the leadframe parallel and adjacent to the at least one lead facing the chip mounting portion and forming a wire-like bond between the semiconductor chip and the at least one second lead.

13. A method for manufacturing a semiconductor product package, the method comprising:
arranging a leadframe comprising one or more leads such that each lead has an inner end extending toward facing a portion of a die-pad;
attaching a semiconductor chip to the die-pad;
attaching a first electrically conductive mass to the die-pad such that it is aligned with the inner end of a lead extending toward the portion of the die-pad such that the inner end of the lead protrudes over the die-pad;
attaching an electrical component to the first electrically conductive mass such that a longitudinal axis of the electrical component is arranged transverse to the die-pad; and coupling a second electrically conductive mass between a termination of the electrical component and the inner end of the lead.

14. The method of claim 13, further comprising applying an agent to facilitate adhesion of the first electrically conductive mass to the die-pad before attaching the first electrically conductive mass.

15. The method of claim 13, wherein the attaching of the electrical component comprises positioning the electrical component such that its primary dimension is transverse to the die-pad.

16. The method of claim 13, further comprising providing a wire bonding to facilitate electrical coupling of the lead with pads on a surface of the semiconductor chip.

17. The method of claim 13, wherein the electrical component is attached such that it is positioned bridge-like across a gap between the lead and the die-pad.

18. The method of claim 13, wherein the leadframe is arranged such that the inner end of the lead overlaps a portion of the die-pad.

* * * * *